United States Patent [19]

Drouot

[11] Patent Number: 5,555,216

[45] Date of Patent: Sep. 10, 1996

[54] LINE DECODER CIRCUIT FOR A MEMORY WORKING AT LOW SUPPLY VOLTAGES

[75] Inventor: Sylvie Drouot, Luynes, France

[73] Assignee: SGS-Thomson Microelectronics S.A., Saint-Genis, Pouilly, France

[21] Appl. No.: 361,313

[22] Filed: Dec. 21, 1994

[30] Foreign Application Priority Data

Dec. 22, 1993 [FR] France ................................ 9315498

[51] Int. Cl.$^6$ ........................................................... G11C 8/00
[52] U.S. Cl. .......................... 365/230.06; 365/230.03; 326/105
[58] Field of Search .......................... 365/230.06, 230.01, 365/230.03, 231; 326/105, 106, 107

[56] References Cited

U.S. PATENT DOCUMENTS

| | | | |
|---|---|---|---|
| 4,692,638 | 9/1987 | Stiegler | 307/449 |
| 5,202,851 | 4/1993 | Do | 365/189 |
| 5,311,481 | 5/1994 | Casper et al. | 365/230.06 |
| 5,351,217 | 9/1994 | Jeon | 365/230.06 |
| 5,373,479 | 12/1994 | Noda | 365/230.06 |

*Primary Examiner*—David C. Nelms
*Assistant Examiner*—Huan Hoang
*Attorney, Agent, or Firm*—David M. Driscoll; James H. Morris

[57] ABSTRACT

In a line decoder circuit capable of working at low selection voltages, selection transistors are series-connected between an input terminal and an inverter whose output is connected to an output terminal. The inverter has two transistors, respectively a P type transistor and an N type transistor, that are series-connected. The control gate of the first transistor is connected to the selection transistors, while the control gate of the second transistor is connected to the input terminal.

44 Claims, 3 Drawing Sheets

LINE DECODER CIRCUIT FOR A MEMORY WORKING AT LOW SUPPLY VOLTAGES

BACKGROUND OF THE INVENTION

1. Field of the Invention

The invention relates to a line decoder integrated circuit for a memory working at low supply voltages.

2. Discussion of the Related Art

A line decoder is used notably for the selection or deselection of memory lines organized in matrix form. The term "selection" or "deselection" of a line is understood to mean the fact of imposing a certain voltage on this line. In formal terms, this implies a binary state that can therefore be symbolized by a logic 1 or a logic 0. In practice, it is usually understood that the selection of a line means carrying it to a certain positive potential (logic 1) and that the deselection means carrying it to a ground potential (logic 0). However, the value of the positive potential may differ according to whether the line is selected to read the state of a cell or to write a state therein.

The memories generally comprise several thousands of lines. When it is sought to select a cell of these memories, a word line and bit line are selected, the intersection of these lines corresponding to the cell. If a memory has, for example, a total of 2048 lines, these lines can be addressed with a word address comprising 11 bits that are referenced, for example, A10 to A0. In order to facilitate fast access to these lines, the memory is generally divided into blocks of lines. When a line has to be accessed the block that contains this line is accessed first. For example, a 2048-line memory can be divided into eight blocks of 256 lines.

To make it easy to decode line addresses to be selected or deselected, these blocks can be further sub-divided into sub-blocks, and so on and so forth. For example, it is possible to define a variable M representing the bits A10 to A8, a variable L representing the bits A7 to A4 and a variable P representing the bits A3 to A0. Thus, it can be shown that the time taken to gain access to the line to be selected is accelerated.

Since the variable M represents three bits, the lines of the memory can be grouped into eight blocks of 256 lines corresponding to the eight possible values of M (M0 to M7). Similarly, since the variable L represents four bits, the 16 possible values of L (L0 to L15) make it possible to determine 16 sub-blocks of 16 lines for each of the 8 blocks. Finally, the 16 possible values of P (P0 to P15) can be used to determine the 16 lines of the sub-block. Thus, each line will correspond to a triplet of variables M, L, P.

Since the lines are generally long, it is sometimes desirable to select only one part of a line. This makes it possible to take steps to counter the capacitive effects that delay the time needed for gaining access to the cells. For example, the lines are divided into two sectors. It is then enough to determine an additional sector variable N corresponding to a bit that takes one of two values N0 and N1. Thus, 4096 half lines corresponding to 2048 lines will be encoded. In practice, a line decoder of a memory array is placed in the middle of the memory array, defining right-hand and left-hand sectors or top and bottom sectors.

In the prior art, there is a known type of line decoder circuit such as shown at 70 in FIG. 5. This type of line decoder circuit comprises, for each line, a decoder circuit 72 or 74 including an input terminal 20 to receive a binary selection signal that typically comes from a NAND gate 22, supplied for all decoder circuits 72, 74, with several inputs. In the configuration described here above, there would be, for example, a three-input NAND gate corresponding to a triplet of values of the variables (N,M, L) defining a given block, sub-block and sector. Thus, a NAND gate 22 would be connected to 16 lines of a given sub-block, in a given sector. There would be 16 NAND gates per block, giving 128 NAND gates for the sector and 256 NAND gates for the entire memory. For a given sub-block of a given sector, these 16 lines will each be defined by a variable P value (P0 to P15).

For a given line, the input terminal 20 is connected to a selection transistor 24 between this input terminal and an inverter 26 whose output is connected to the line that is selected or deselected by this line decoder.

The selection transistor 24 is, for example, an N type transistor. Its drain 25 is connected to the input terminal 20. The control gate 28 of this transistor is connected to a selection voltage terminal 30 and its source 32 is connected to the input 34 of an inverter 26. This inverter 26 has two transistors 36 and 38, which are respectively P (38) and N (36)-type transistors that are series-connected between a line supply terminal 40 and a ground terminal 42. The output 44 of the inverter 26, constituted by the drains 46 of the two transistors 36 and 38 connected to each other, is connected to the line associated with the line decoder. The line supply terminal 40 gives the voltage desired at the line when it is selected, namely the read voltage or write voltage or any other voltage. The line supply terminal 40 therefore gives a potential corresponding to the selection logic 1 level. The potential corresponding to the deselection logic 0 level will be given by the ground terminal 42. The magnitude of the line supply voltage varies according to the technology used to make the memory of which the line forms a part.

The input 34 of the inverter 26, formed by the control gates 47 and 48 of the two transistors 36 and 38 connected to each other, is also connected to the drain 50 of a P type transistor 52 whose source 54 is connected to the line supply terminal 40 and whose control gate 56 is connected to the output 44 of the inverter 26.

Let us consider, for example, a line corresponding to a quadruplet of values (Na, Mb, Lc, Pd) of the variables (N, M, L, P) where a is an integer ranging from 0 to 2, b is an integer ranging from 0 to 7 and c and d as integers ranging from 0 to 15.

If it is desired to select this line and carry it thus to the potential of the line supply terminal 40, it is enough to form the address bit on 12 bits corresponding to the quadruplet of values Na, Mb, Lc and Pd. The signals applied to the line decoder circuit and corresponding to the variables N, M, L, P will then go to the logic 1 state. The selection transistor 24 is then on and the output of the NAND gate 22 is in the logic 0 state (in practice, the ground potential). The inverter 26 thus takes the line to the desired potential by means of its P type transistor 38.

If the line is to be deselected, it is enough for one of the values of the variables N, M, L or P to be different. The signal corresponding to this variable will thus go to the logic 0 state. The line in question is then connected to the ground by means of the N type transistor 36 of the inverter.

In practice, it is possible to reserve a quadruplet of values of the variables N, M, L, P for the deselection of all the lines of the memory. Thus, the deselection of a line by the changing of the address formed will not give rise to the selection of another line corresponding to the new address. It is also possible to add an additional address bit whose value would determine whether the operation to be carried out is a selection or a deselection.

To enable the testing of the cells of the memory array, the method generally used is that of adding on an N type insulation transistor 58 in series with the selection transistor 24. The control gate 60 of this transistor 58 is connected to the line supply terminal 40. Thus, during tests, the line supply voltage can be made to drop without any risk of short-circuiting this supply with the positive supply of the NAND gates. Indeed, the cells of certain non-volatile memories require high control voltages of 10 volts for example. A distinction is therefore made between the line supply voltage that may be present on the line and the selection voltages. For example, the logic circuits such as the NAND gates are typically supplied at a voltage of the order on five volts.

This type of circuit does not always work properly at a low input voltage. Nonetheless, it is increasingly being sought to obtain products with low selection voltages, on the order of three volts for example.

The improper operation of the type of line decoder described above is due to the presence of the selection transistor 24 which induces losses between the input terminal 20 and the input of the inverter due to the threshold voltage of this transistor. If the selection transistor is an enhanced type of transistor, its threshold voltage is typically on the order of one volt or even more, depending on the substrate effect. This higher threshold voltage causes problems in controlling the N-type transistor of the inverter. In particular, line deselection time increases substantially and it may actually become impossible to control the N-type transistor of the inverter at all.

The use of a selection transistor without implantation, known as a native or natural transistor, could be used to solve this problem. This type of transistor has a low threshold voltage of the order on 0.1 to 0.4 volts. However, this approach would necessitate a procedure for certifying this type of technology, and this is a particularly lengthy and costly procedure. It is also possible to solve this problem by increasing the selection voltage by pumping. This approach has the drawback of requiring additional circuits, which entails losses in terms of space required, consumption and reliability.

In the light of the above, one general aim of the present invention is to propose a line decoder circuit capable of working for low selection voltages without calling for pumping at these voltages.

SUMMARY OF THE INVENTION

In the device of the invention, the mounting of a line decoder of the type described here above is modified by the connection of the N type transistor of the output inverter to the input terminal of the circuit. It is shown then that it is possible in this way to avert the drop in control voltage of the N type transistor of the inverter due to the selection transistors. This transistor can therefore be controlled for selection voltages that are relatively low (but greater than the threshold voltage of this transistor).

According to the invention, this aim is attained by an integrated circuit comprising a line decoder circuit provided with an input terminal to receive a binary selection signal, an output terminal to deliver a binary line signal, reference terminals to give respectively one or more basic voltages, a selection voltage, a line supply voltage and a control voltage, one or more selection transistors that are series-connected between the input terminal and the output terminal, an inverter comprising a first P type transistor and a first N type transistor series-connected between, respectively, the line supply reference terminal and a basic reference terminal, the first P type transistor being connected by its control gate firstly to the drain of a second P type transistor whose source is connected to the line supply reference terminal and whose control gate is connected to the control reference terminal, and secondly to the selection transistors, the output terminal being connected to the midpoint of the inverter, wherein the input terminal is connected to the control gate of the first N type transistor of the inverter.

In a preferred version, the output terminal of this circuit is connected to the drain of a second N type transistor whose source is connected to a basic reference terminal and whose control gate is connected to the output of an inverter whose input is connected to the selection reference terminal.

BRIEF DESCRIPTION OF THE DRAWINGS

Other particular features and advantages of the present invention shall appear from the following detailed description of a preferred exemplary embodiment, made with reference to the appended drawings, of which.

This description is given by way of example and in no way restricts the scope of the invention.

DETAILED DESCRIPTION

Figure 1:
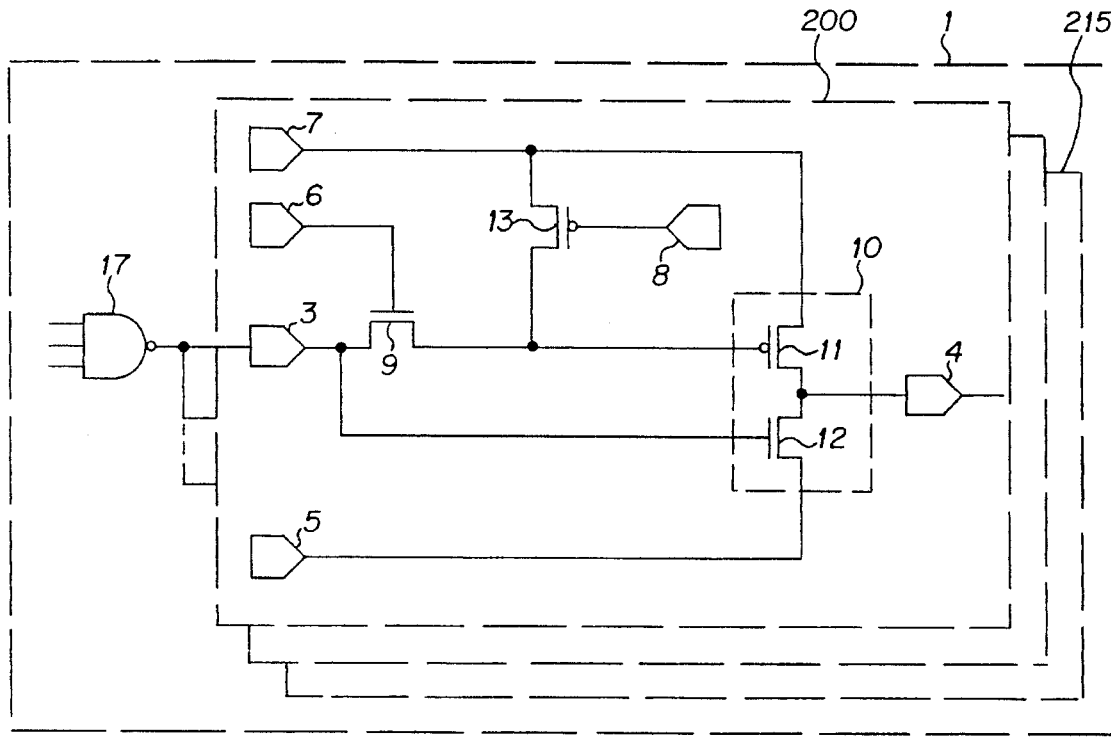
FIG. 1 is an electrical diagram of the basic circuit according to the invention.

FIG. 1 illustrates an integrated circuit 1 comprising decoder circuits 200 to 215. The circuits 200 to 215 are represented by juxtaposed boxes of dashed lines. With a view to clarity, the circuits 200 to 215 are not all shown.

According to the exemplary organization of a memory described here above, these circuits 200 to 215 correspond to 16 lines of a given sub-block and sector. According to the example considered, the inputs of these 16 decoder circuits are connected to the output of a NAND gate 17 with several inputs (three inputs in the structure described as an example).

Hereinafter, the description shall be limited to a single circuit 200, it being understood that the decoder circuits 200 to 215 are structurally identical.

The decoder circuit 200 includes an input terminal 3 which receives a binary selection signal, an output terminal 4 which delivers a binary line signal, and reference terminals 5, 6, 7, 8 which provide respectively one or more basic voltages, a selection voltage, a line supply voltage and a control voltage. The selection signal received at the input terminal 3 is given by the output of the three-input NAND gate 17. As we have seen in the prior art, the line is then selected when the signal at output of the NAND gate 17 is in the logic 0 state. The output terminal 4 is connected to a line associated with the decoder circuit 200.

In practice, a basic reference terminal 5 connected to the ground is used. It is possible, however, to use several basic reference terminals. Hereinafter, the description shall concentrate on the former possibility. The selection voltage, for its part, is a positive voltage for the supply of the circuit 1 which may be relatively low, on the order of three volts, or equal to the ground potential. If the selection terminal is at the positive potential of a supply of the circuit 1, this fact corresponds to a selection. If the selection terminal is at the ground potential, it corresponds to a deselection. The binary selection signal assumes a value of three volts to represent a logic 1 state and the ground potential to represent a logic 0 state.

The line supply voltage and the positive selection voltage (corresponding to a selection) are generally distinct. The line supply voltage is generally higher than the selection voltage, for the non-volatile memories for example. However, it may be lower for sequences of tests on the characteristics of the memory cells for example.

The control voltage is, in practice, slightly lower than the line supply voltage. For example, assuming a line voltage of the order of 12 volts, the value of the control voltage taken will be on the order of 10 volts. The binary line signal will take the value of the line supply voltage in the event of selection. It will take The value of the potential of the basic reference terminal 5 in the event of deselection. The selection voltage, line supply voltage, and control voltage are generally received by terminals 6, 7 and 8, respectively, from a source external to the line decoder circuit.

The circuit 200 also includes one or more selection transistors 9 series-connected between the input terminal 3 and the output terminal 4. In the exemplary embodiment chosen, only one selection transistor 9 is used. The control gate of this selection transistor 9 is connected to the selection terminal 6. This selection transistor 9, depending first on the values of the voltage applied to its control gate and, second, on the binary selection signal, enables the selection or deselection of the line associated with the decoder circuit 200. In a first exemplary embodiment, the drain of the selection transistor 9 is connected to the input terminal 3.

The line decoder circuit 200 will also include an inverter 10. This inverter 10 has a first P-type transistor 11 and a first N-type transistor 12. This P-type transistor 11 and N-type transistor 12 are series-connected between the line supply terminal 7 and the basic reference terminal 5.

A series connection of two transistors is a connection by their active regions, namely a drain-to-drain or a drain-to-source connection. In the inverter 10, the P-type transistor 11 and the N-type transistor 12 are thus connected by their drains which then form the output of the inverter 10. The source of the P-type transistor 11 is connected to the line supply terminal 7 and the source of the N-type transistor 12 is connected to the basic reference terminal 5.

The control gate of the P-type transistor 11 is connected, firstly, to the source of the selection transistor 9 and, secondly, to the drain of a second P-type transistor 13. The source of this second P-type transistor 13 is connected to the line supply terminal 7 and its control gate is connected to the control terminal 8. The control gate of the first N-type transistor 12 is connected to the input terminal 3.

A line is selected by providing a binary selection signal at the logic 0 level (ground voltage) and a selection signal corresponding to the logic 1 level (3 volts in the example chosen). The N-type transistor 12 of the inverter is then off while the selection transistor 9 is on. The P-type transistor 11 of the inverter 10 is then on and connects the output terminal 4 to the line supply.

The deselection is done by providing a binary selection signal at the logic 1 level and a selection voltage at the logic 0 level. The N-type transistor 12 of the inverter 10 therefore turns on and thus connects the output terminal 4 to the ground. Furthermore, the selection transistor 9 is then off. The second P-type transistor 13 then connects the control gate of the first P type transistor 11 to the selection terminal 7. This turns this transistor 11 off.

The circuit described in FIG. 1 can be improved. For example, if when the line is selected, the selection voltage goes to the logic 0 level while the binary selection signal remains at the logic 0 state, then there is a floating output on the line. Also, in the mode of operation described, the second P-type transistor 13 is always on, which makes it necessary to have a resistive transistor to limit the consumption.

Finally, if the line supply voltage drops, for example to carry out tests on the memory cells, there is no longer any insulation between the line supply voltage terminal and the selection voltage terminal, should the second P-type transistor 13 be on and should the input terminal 3 itself be connected to a conductive P-type transistor whose source is connected to the selection voltage terminal at the logic 1 level (3 volts). This condition can occur if the input terminal 3 is connected to the output of a NAND gate 17 that is positively supplied as has been specified in description of the prior art.

Figure 2:
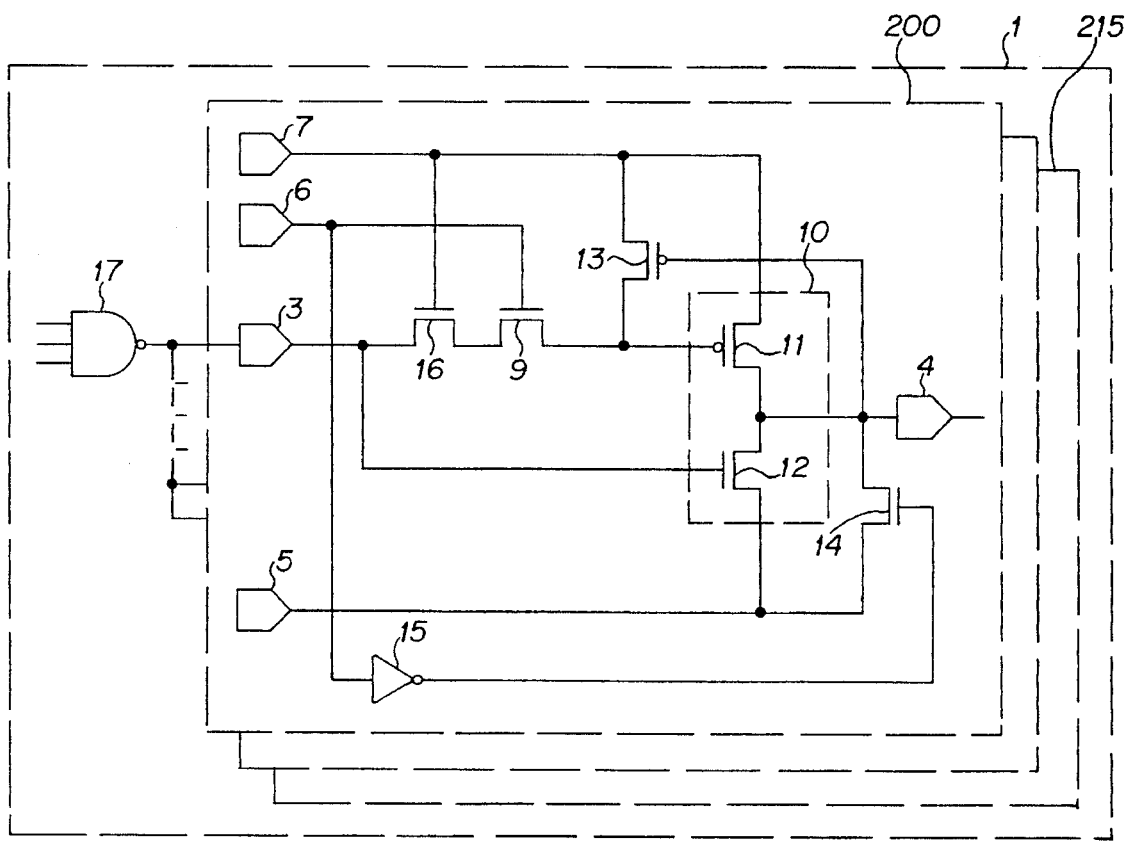
FIG. 2 shows a preferred embodiment of the invention.
Figure 3:
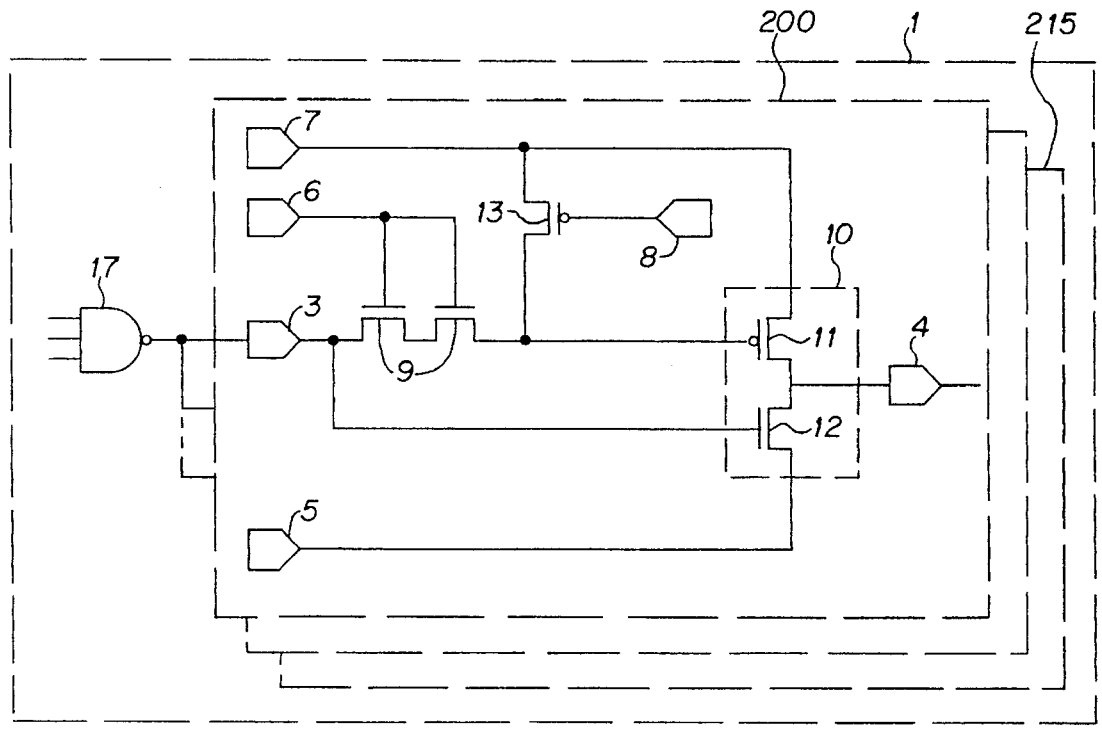
FIG. 3 is a circuit diagram of another embodiment of the invention.
Figure 4:
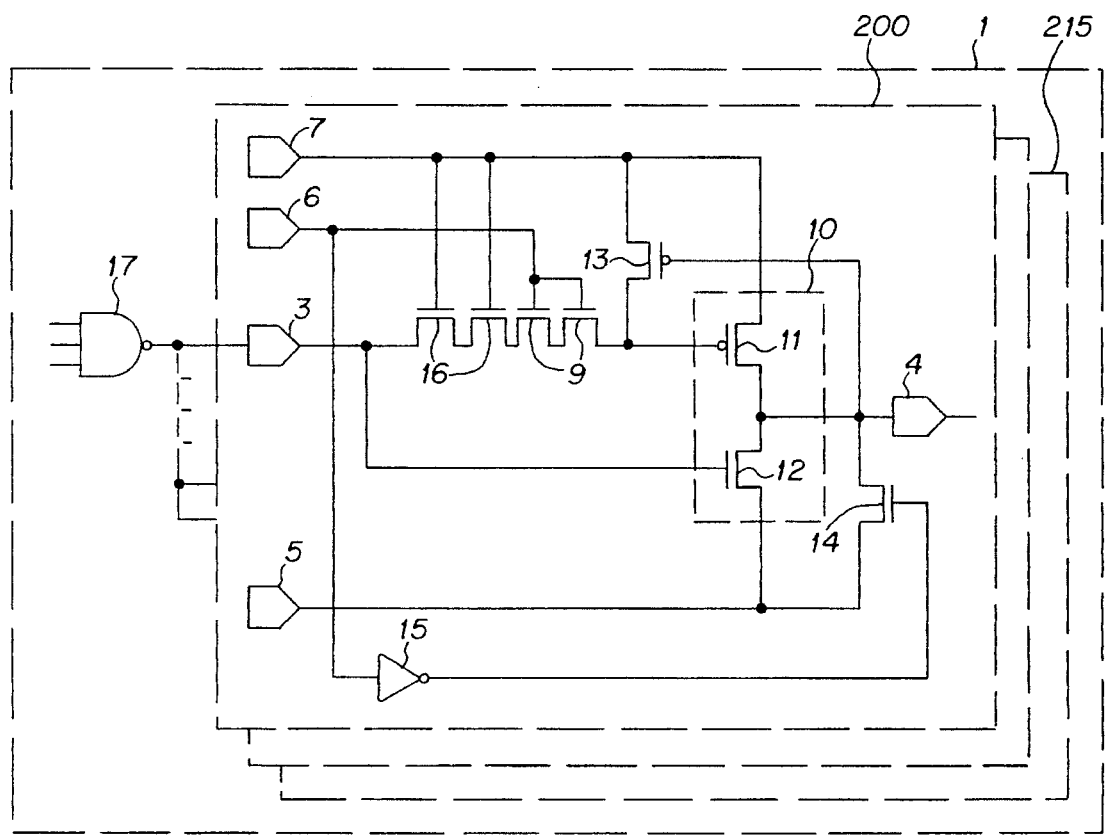
FIG. 4 is a circuit diagram of yet another embodiment of the invention.
Figure 5:
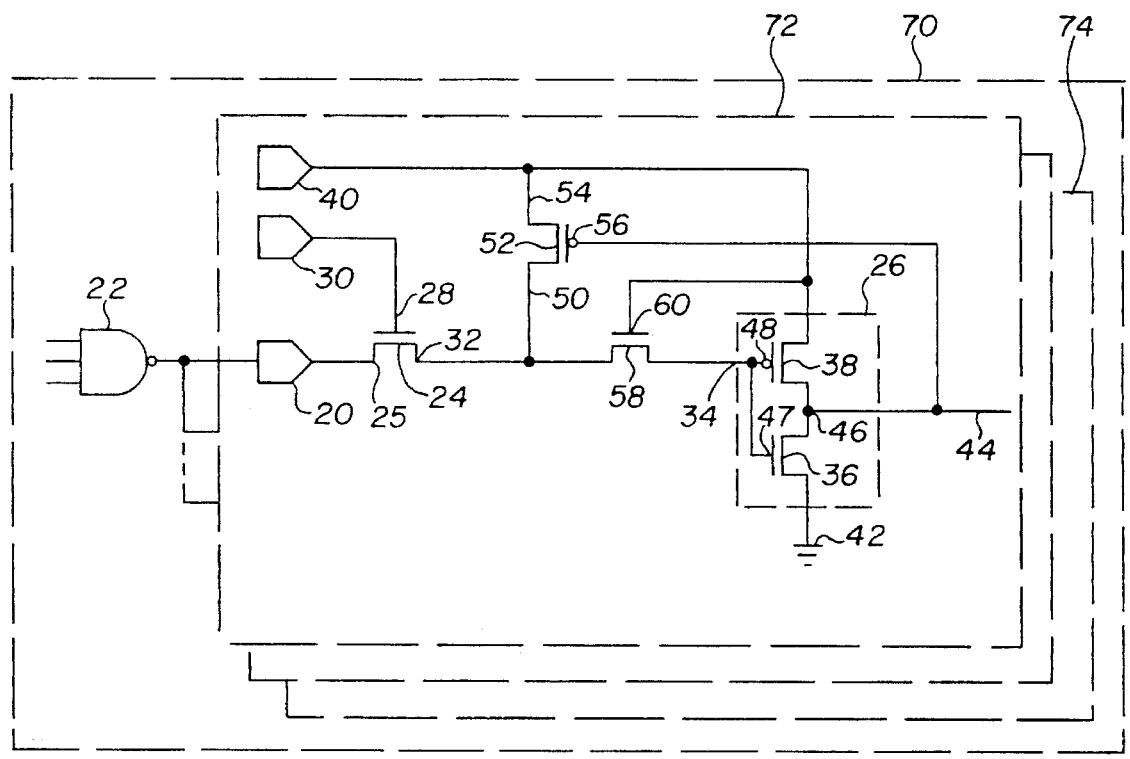
FIG. 5 is an electrical diagram of the conventional decoder circuit.

These drawbacks are overcome by the circuit shown in FIG. 2.

The first drawback of the circuit of FIG. 1 is overcome by connecting the output terminal 4 to the drain of a second N type transistor 14 whose source is connected to the basic reference terminal 5 and whose control gate is connected to the output of an inverter 15 whose input is connected to the selection terminal 6. Should there be many selection transistors, there will be of course be as many N-type transistors added at output, each of these transistors corresponding to a selection transistor.

The decoder according to the invention is thus a little larger than a prior art decoder—there is one additional transistor if a selection transistor is used. A decoder circuit according to the invention can therefore be contained in the width of one line in an integrated circuit.

The second drawback of the circuit of FIG. 1 is overcome by connecting the control gate of the second P-type transistor 13 to the output terminal 4. The control voltage is then equal to the voltage present at the output terminal 4. Thus, the transistor 13 consumes power only when it is in a transient state, i.e., during changes in the state of the line. While this approach is satisfactory from a functional point of view, it may prove to be difficult to implement. This is because the lines are thin: for example their thickness is typically 1.7 micrometers. The making of this connection, which is a loop, is therefore not a simple matter, because it is necessary to have the line connecting transistor 13 to output 4 made on a different level of metallization than the connection between terminal 7 and transistor 11.

As for the third drawback, it is overcome by the series connection of an insulation transistor with the selection transistor 9. For example, an N-type transistor 16 is connected between the input terminal 3 and the drain of the selection transistor 9. Preferably, the connection of the control gate of the N-type transistor 12 to the input terminal 3 will be done upline with respect to this insulation transistor and not between the insulation transistor 16 and the selection transistor 9. In this arrangement, the insulation transistor 16 does not disturb the activation of the N-type transistor 12 of the inverter 10. The drain of the selection transistor 9 is then connected to the source of the insulation transistor 16 and the drain of the insulation transistor 16 is connected to the input terminal 3. The control gate of the insulation transistor 16 is connected to the line supply terminal 7. Naturally, this input terminal 3 is then disconnected from the drain of the selection transistor 9.

The presence of the insulation transistor 16 makes it possible, deliberately and without risk, to reduce the line supply voltage. This reducing of the line supply voltage makes it possible to determine the characteristics of the memory cells. In practice, this insulation transistor is used in a stage when the final adjustments to the circuit are made. However, it remains in the circuit during final production and use because removing it would necessitate creating new manufacturing masks as well as defining another certification procedure. Also, there is a risk that the memory cells would not have the same characteristics as those obtained with the insulation transistor.

As has been shown, the invention enables operation at low selection voltages, even if the only manufacturing technology available is of the enhanced type. Of course, the invention continues to be equally promising if native or natural type transistors are used. In any case, the deselection time will be shorter if the control gate of the N type transistor 12 of the inverter 10 is connected to the input terminal 3.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. For example, the selection transistors may be P-type transistors, though they would be thicker and would require additional manufacturing steps. Accordingly, the foregoing description is by way of example only and is not intended as limiting. The invention is limited only as defined in the following claims and the equivalents thereto.

What is claimed is:

1. An integrated circuit comprising a line decoder circuit, comprising:
   an input terminal for receiving a binary selection signal;
   an output terminal for delivering a binary line signal;
   a first reference terminal for receiving a ground voltage;
   a second reference terminal for receiving a line supply voltage;
   a third reference terminal for receiving a selection voltage;
   a fourth reference terminal for receiving a control voltage;
   a selection transistor having a control gate connected to the third reference terminal, a source and a drain coupled to the input terminal;
   an inverter comprising a first P-type transistor having a source connected to the second reference terminal, a drain and a control gate connected to the source of the selection transistor and forming an input of the inverter, and a first N-type transistor having a source connected to the first reference terminal, a drain connected to both the drain of the first P-type transistor and the output terminal and a control gate;
   a second P-type transistor having a source connected to the second reference terminal and a control gate connected to the fourth reference terminal and a drain connected to the control gate of the first P-type transistor of the inverter; and
   wherein the input terminal is connected to the control gate of the first N-type transistor of the inverter.

2. The integrated circuit of claim 1, further comprising:
   a second N-type transistor having a source connected to the first reference terminal, a drain connected to the output terminal and a control gate;
   a second inverter having an input connected to the third reference terminal and an output connected to the control gate of the second N-type transistor.

3. The integrated circuit of claim 1 wherein the selection transistor is an N-type transistor.

4. The integrated circuit of claim 3, wherein the selection transistor is an enhanced-type transistor.

5. The integrated circuit of claim 1 further comprising an insulation transistor series-connected with the selection transistor between the input terminal and the input of the inverter.

6. The integrated circuit of claim 5, wherein the insulation transistor is an N-type transistor.

7. The integrated circuit of claim 6, wherein the insulation transistor is an enhanced-type transistor.

8. The integrated circuit of claim 1 wherein the input terminal is connected to an output of a NAND logic gate with several inputs.

9. The integrated circuit of claim 1, wherein the fourth reference terminal is connected to the output terminal.

10. The integrated circuit of claim 1, wherein the selection transistor is coupled to the input terminal via an insulation transistor having a control gate connected to the second reference terminal, a drain connected to the input terminal and a source connected to the drain of the selection transistor.

11. The integrated circuit of claim 1, wherein the selection transistor is coupled to the input terminal via a plurality of series-connected insulation transistors, wherein one of the insulation transistors has a drain connected to the input terminal and one of the insulation transistors has a source connected to the drain of the selection transistor, and each insulation transistor has a control gate connected to the second reference terminal.

12. A memory circuit, comprising:
   (i) a plurality of memory lines organized in a matrix form;
   (ii) a line decoder circuit provided for each memory line for selection and deselection of the memory line and including:
   (a) an input terminal for receiving a binary selection signal;
   (b) an output terminal for delivering a binary line signal;
   (c) a first reference terminal for receiving a ground voltage;
   (d) a second reference terminal for receiving a line supply voltage;
   (e) a third reference terminal for receiving a selection voltage;
   (f) a fourth reference terminal for receiving a control voltage;
   (g) a selection transistor having a control gate connected to the third reference terminal, a source and a drain coupled to the input terminal;
   (h) an inverter comprising a first P-type transistor having a source connected to the second reference terminal, a drain and a control gate connected to the source of the selection transistor and forming an input of the inverter, and a first N-type transistor having a source connected to the first reference terminal, a drain connected to both the drain of the first P-type transistor and the output terminal and a control gate;

(i) a second P-type transistor having a source connected to the second reference terminal and a control gate connected to the fourth reference terminal and a drain connected to the control gate of the first P-type transistor of the inverter; and (j) wherein the input terminal is connected to the control gate of the first N-type transistor of the inverter.

13. The memory circuit of claim 12, wherein the line decoder circuit further comprises:

a second N-type transistor having a source connected to the first reference terminal, a drain connected to the output terminal and a control gate;

a second inverter having an input connected to the third reference terminal and an output connected to the control gate of the second N-type transistor.

14. The memory circuit of claim 12 wherein the selection transistor is an N-type transistor.

15. The memory circuit of claim 14, wherein the selection transistor is an enhanced-type transistor.

16. The memory circuit of claim 12 further comprising an insulation transistor series-connected with the selection transistor between the input terminal and the input of the inverter.

17. The memory circuit of claim 16, wherein the insulation transistor is an N-type transistor.

18. The memory circuit of claim 17, wherein the insulation transistor is an enhanced-type transistor.

19. The memory circuit of claim 12 further comprising, for each line decoder circuit, a NAND logic gate with several inputs and an output connected to the input terminal of the respective line decoder circuit.

20. The memory circuit of claim 12, wherein the fourth reference terminal is connected to the output terminal.

21. The memory circuit of claim 12, wherein the selection transistor is coupled to the input terminal via an insulation transistor having a control gate connected to the second reference terminal, a drain connected to the input terminal and a source connected to the drain of the selection transistor.

22. The memory circuit of claim 12, wherein the selection transistor is coupled to the input terminal via a plurality of series-connected insulation transistors, wherein one of the insulation transistors has a drain connected to the input terminal and one of the insulation transistors has a source connected to the drain of the selection transistor, and each insulation transistor has a control gate connected to the second reference terminal.

23. An integrated circuit comprising a line decoder circuit, comprising:

an input terminal for receiving a binary selection signal;

an output terminal for delivering a binary line signal;

a first reference terminal for receiving a ground voltage;

a second reference terminal for receiving a line supply voltage;

a third reference terminal for receiving a selection voltage;

a fourth reference terminal for receiving a control voltage;

an inverter comprising a first P-type transistor having a source connected to the second reference terminal, a drain and a control gate forming art input of the inverter, and a first N-type transistor having a source connected to the first reference terminal, a drain connected to both the drain of the first P-type transistor and the output terminal and a control gate;

a plurality of series-connected selection transistors, wherein one of the series-connected selection transistors has a drain coupled to the input terminal, and wherein each of the series-connected transistors has a control gate connected to the third reference terminal, and wherein one of the series-connected selection transistors has a source connected to the input of the inverter;

a second P-type transistor having a source connected to the second reference terminal and a control gate connected to the fourth reference terminal and a drain connected to the control gate of the first P-type transistor of the inverter;

wherein the input terminal is connected to the control gate of the first N-type transistor of the inverter.

24. The integrated circuit of claim 23, further comprising:

a second N-type transistor having a source connected to the first reference terminal, a drain connected to the output terminal and a control gate;

a second inverter having an input connected to the third reference terminal and an output connected to the control gate of the second N-type transistor.

25. The integrated circuit of claim 23 wherein the selection transistors are N-type transistors.

26. The integrated circuit of claim 25, wherein the selection transistors are enhanced-type transistors.

27. The integrated circuit of claim 23 further comprising an insulation transistor series-connected with the selection transistors between the input terminal and the input of the inverter.

28. The integrated circuit of claim 27, wherein the insulation transistor is an N-type transistor.

29. The integrated circuit of claim 28, wherein the insulation transistor is an enhanced-type transistor.

30. The integrated circuit of claim 23 wherein the input terminal is connected to an output of a NAND logic gate with several inputs.

31. The integrated circuit of claim 23, wherein the fourth reference terminal is connected to the output terminal.

32. The integrated circuit of claim 23, wherein the one of the selection transistors is coupled to the input terminal via an insulation transistor having a control gate connected to the second reference terminal, a drain connected to the input terminal and a source connected to the drain of the one of the selection transistors.

33. The integrated circuit of claim 23, wherein the one of the selection transistors is coupled to the input terminal via a plurality of series-connected insulation transistors, wherein each insulation transistor has a control gate connected to the second reference terminal, and wherein one of the insulation transistors has a drain connected to the input terminal and wherein one of the insulation transistors has a source connected to the drain of the one of the selection transistors.

34. A memory circuit, comprising:

(i) a plurality of memory lines organized in a matrix form;

(ii) a line decoder circuit provided for each memory line for selection and deselection of the memory line and including:

(a) an input terminal for receiving a binary selection signal;

(b) an output terminal for delivering a binary line signal;

(c) a first reference terminal for receiving a ground voltage;

(d) a second reference terminal for receiving a line supply voltage;

(e) a third reference terminal for receiving a selection voltage;

(f) a fourth reference terminal for receiving a control voltage;

(g) an inverter comprising a first P-type transistor having a source connected to the second reference terminal, a drain and a control gate forming an input of the inverter, and a first N-type transistor having a source connected to the first reference terminal, a drain connected to both the drain of the first P-type transistor and the output terminal and a control gate;

(h) a plurality of series-connected selection transistors, wherein one of the series-connected selection transistors has a drain coupled to the input terminal and wherein each of the series-connected transistors has a control gate connected to the third reference terminal, and wherein one of the series-connected selection transistors has a source connected to the input of the inverter;

(i) a second P-type transistor having a source connected to the second reference terminal and a control gate connected to the fourth reference terminal and a drain connected to the control gate of the P-type transistor of the inverter;

(j) wherein the input terminal is connected to the control gate of the first N-type transistor of the inverter.

35. The memory circuit of claim 34, further comprising:

a second N-type transistor having a source connected to the first reference terminal, a drain connected to the output terminal and a control gate;

a second inverter having an input connected to the third reference terminal and an output connected to the control gate of the second N-type transistor.

36. The memory circuit of claim 34 wherein the selection transistors are N-type transistors.

37. The memory circuit of claim 36, wherein the selection transistors are enhanced-type transistors.

38. The memory circuit of claim 34 further comprising an insulation transistor series-connected with the selection transistors between the input terminal and the input of the inverter.

39. The memory circuit of claim 38, wherein the insulation transistor is an N-type transistor.

40. The memory circuit of claim 39, wherein the insulation transistor is an enhanced-type transistor.

41. The memory circuit of claim 34, further comprising, for each line decoder circuit, a NAND logic gate with several inputs and an output connected to the input terminal of the respective line decoder circuit.

42. The memory circuit of claim 34, wherein the fourth reference terminal is connected to the output terminal.

43. The memory circuit of claim 34, wherein the one of the selection transistors is coupled to the input terminal via an insulation transistor having a control gate connected to the second reference terminal, a drain connected to the input terminal and a source connected to the drain of one of the selection transistor.

44. The integrated circuit of claim 34, wherein the one of the selection transistors is connected to the input terminal via a plurality of series-connected insulation transistors, wherein each insulation transistor has a control gate connected to the second reference terminal, and wherein one of the insulation transistors has a drain connected to the input terminal and wherein one of the insulation transistors has a source connected to the drain of the one of the selection transistors.

* * * * *